United States Patent
Wong et al.

(10) Patent No.: US 6,345,000 B1
(45) Date of Patent: *Feb. 5, 2002

(54) FLASH MEMORY PERMITTING SIMULTANEOUS READ/WRITE AND ERASE OPERATIONS IN A SINGLE MEMORY ARRAY

(75) Inventors: Sau C. Wong, Hillsborough; Hock C. So, Redwood City; Cheng-Yuan Michael Wang; Roger Ying Kuen Lo, both of San Jose, all of CA (US)

(73) Assignee: SanDisk Corporation, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,971

(22) Filed: Nov. 25, 1998

Related U.S. Application Data

(63) Continuation-in-part of application No. 08/839,288, filed on Apr. 16, 1997, now Pat. No. 5,949,716.

(51) Int. Cl.[7] .............................................. G11C 16/04
(52) U.S. Cl. ............................ 365/185.29; 365/185.05; 365/185.11
(58) Field of Search ....................... 365/185.29, 185.05, 365/185.11

(56) References Cited

U.S. PATENT DOCUMENTS

| | | | |
|---|---|---|---|
| 5,339,271 A | | 8/1994 | Tanagawa |
| 5,748,528 A | * | 5/1998 | Campardo et al. ...... 365/185.13 |
| 5,847,994 A | | 12/1998 | Motoshima et al. |
| 5,923,585 A | * | 7/1999 | Wong et al. ........... 365/185.03 |
| 5,949,716 A | * | 9/1999 | Wong et al. ........... 365/185.29 |
| 5,959,887 A | * | 9/1999 | Rakashina et al. ...... 365/185.13 |

FOREIGN PATENT DOCUMENTS

| | | |
|---|---|---|
| JP | 11220044 | 8/1999 |
| WO | WO9935650 | 7/1999 |

* cited by examiner

Primary Examiner—Richard Elms
Assistant Examiner—Van Thu Nguyen
(74) Attorney, Agent, or Firm—Skjerven Morrill MacPherson LLP

(57) ABSTRACT

A non-volatile Flash memory simultaneously performs an erase operation and a write or read operation in the same array of memory cells. The memory has a row based sector architecture, i.e., sectors that contain one or more complete rows of memory cells. During an erase operation, an erase voltage applied to the source lines for one or more rows corresponding to a sector does not affect write or read operations being performed in other sectors, i.e., other rows. Similarly, voltages applied to row lines for access to a memory cell have no effect on the erase operation being performed in another sector. A column line voltage applied for access to a memory cell has little affect on the erase operation. The memory can implement a look-ahead erase for a continuous reading or writing operation.

49 Claims, 3 Drawing Sheets

FLASH MEMORY PERMITTING SIMULTANEOUS READ/WRITE AND ERASE OPERATIONS IN A SINGLE MEMORY ARRAY

CROSS-REFERENCE TO THE RELATED APPLICATIONS

This is a continuation-in-part of patent application Ser. No. 08/839,288 field Apr. 16, 1997, now U.S. Pat. No. 5,949,716.

BACKGROUND

1. Field of the Invention

This invention relates to non-volatile memory architectures and methods for simultaneously erasing memory cells in a memory array while reading or writing other memory cells in the same memory array.

2. Description of Related Art

A conventional erasable non-volatile semiconductor memory includes an array of memory cells arranged in rows and columns. Each memory cell typically includes a memory transistor, such as floating or split gate transistor, having a control gate coupled to an associated row (or word) line in the array, a drain coupled to an associated column (or bit) line in the array, and a source coupled to associated source line in the array. Each memory cell may also include a select transistor located between the drain or source of a floating gate transistor and the associated column or source line. A threshold voltage of the memory transistor represents stored information. Typically, to write data in memory cells, the memory cells are first erased to set the threshold voltage of the memory transistor in an erased state, for example, a low (or a high) threshold voltage level. Data are then written to the memory cells by programming selected cells to raise (or lower) the threshold voltage of the memory transistor.

A Flash memory simultaneously erases all memory cells in a sector of a memory array. A sector is defined as a group of memory cells which share a common erase/source line. One conventional erase process grounds the row lines in the memory array ("grounded-gate erase" scheme), allows the column lines in the array to float, and applies an erase voltage (typically about 12 volts) to the source line or lines coupled to the sector being erased. Another known erase process applies a negative voltage (typically about −10 volts) to the row line or lines coupled to the memory cells in the sector being erased ("negative-gate erase" scheme), allows the column lines in the array to float, and applies a lower positive erase voltage (typically about 5 volts) to the source line or lines coupled to memory cells in the sector being erased. These erase processes rely on Fowler-Nordheim tunneling to reduce the negative charge on floating gates of the memory transistors being erased and thereby lower the threshold voltages of the erased memory transistors. Erase processes using Fowler-Nordheim tunneling are relatively slow.

In a single array, erase processes usually cannot be simultaneous with write or read processes because write and read processes require bias conditions on row (or gate), column, and source that differ from bias conditions used for an erase process. For example, EPROMs and Flash EPROMs conventionally use a write process that relies on channel hot electron (CHE) injection to increase the threshold voltage of a selected memory transistor. Table 1 below lists typical bias conditions for erase, write, and read processes. The write process is for a typical CHE process, which creates in the selected memory transistor a current that injects channel hot electrons into the floating gate of the memory transistor and increases the threshold voltage of the memory transistor to a desired value. The erase process lists conditions for both the erase processes mentioned above, i.e., the grounded-gate scheme and negative-gate erase scheme. The voltage applied to the gate or row line associated with the selected memory transistor is $V_g$, the voltage applied to the drain or column line associated with the selected memory transistor is $V_d$, and the voltage applied to the source or source line associated with the selected memory transistor is $V_s$.

TABLE 1

|  | $V_g$ | $V_d$ | $V_s$ | substrate |
|---|---|---|---|---|
| grounded-gate erase | 0 V | float | ~12 V | 0 V |
| negative-gate erase | ~−10 V | float | ~5 V | 0 V |
| write | 8 to 12 V | 5 to 6 V | 0 V | 0 V |
| read | ~3 to 7 V | ~1.5 V | 0 V | 0 V |

Certain applications of non-volatile memory would benefit from the ability to simultaneously perform erase and write or read operations. For example, analog Flash memory can record continuous analog signals such as sound or voice signals and may require erasing sectors of the flash memory during the recording to provide storage to maintain a continuous recording process. U.S. patent application Ser. No. 08/839,288, now U.S. Pat. No. 5,949,716, entitled "Look-Ahead Erase For Sequential Data Storage," which is hereby incorporated by reference herein in its entirety, describes structures and methods that simultaneous erase a sector in one memory array while writing to a sector in another memory array. These memories employ multiple array architectures which may be more costly and require more overhead and complexity than conventional single array architectures. For digital applications, conventional or multi-bit-per-cell storage, simultaneous erase and write/read capabilities offer significant cost savings to the system designer. In addition to Flash memory, many of today's embedded systems contain additional memory devices such as EEPROM or SRAM devices. Previously, these separate devices were required to store parameter/configuration code and/or user specification data. Furthermore, a separate memory device was required to run the Flash memory program and write algorithms. By eliminating the need for these devices, lower system level costs and simpler memory designs are possible.

SUMMARY

In accordance with the invention, a memory simultaneously performs an erase operation and a write or read operation in the same array of memory cells. In one embodiment, the memory is a Flash memory having a row based sector architecture, i.e., sectors that contain one or more complete rows of memory cells. During an erase operation, an erase voltage applied to the source lines for one or more rows corresponding to a sector does not affect write or read operations being performed in other sectors, i.e., other rows. Similarly, voltages applied to row lines for access to a memory cell have no effect on the erase operation being performed in another sector because no memory cell experiences both the erase voltage applied to source lines and the access voltage applied to row lines for access. The column line voltage applied for access to a memory cell could affect the erase operation since column lines cross the erased sector. However, if a positive voltage is applied to the column lines for access to the memory cell, that voltage has little effect on the erase process since a floating drain commonly has a positive voltage for a typical erase operation. Additionally, the memory cells in the sector being erased do not conduct or significantly change the voltages on column lines or disturb memory cell accessed for a read or write operation.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, a memory simultaneously erases one sector in a memory array while simultaneously accessing (reading from or writing to) another sector of the memory array. This permits a memory having a single memory array to perform a look-ahead erase process during a write. The look-ahead erase process writes to a current sector while erasing the next sector to be written. When the writing of the current sector is complete, the next sector is fully erased and ready for storage of new data. Note that the next sector can be physically adjacent to the current sector or can be at any location within the same memory array. Accordingly, with the look ahead erase, writing can continuously write data without interruption for erase operations. This effectively "hides" the erase time and increases the overall write bandwidth performance of the device.

Figure 1:
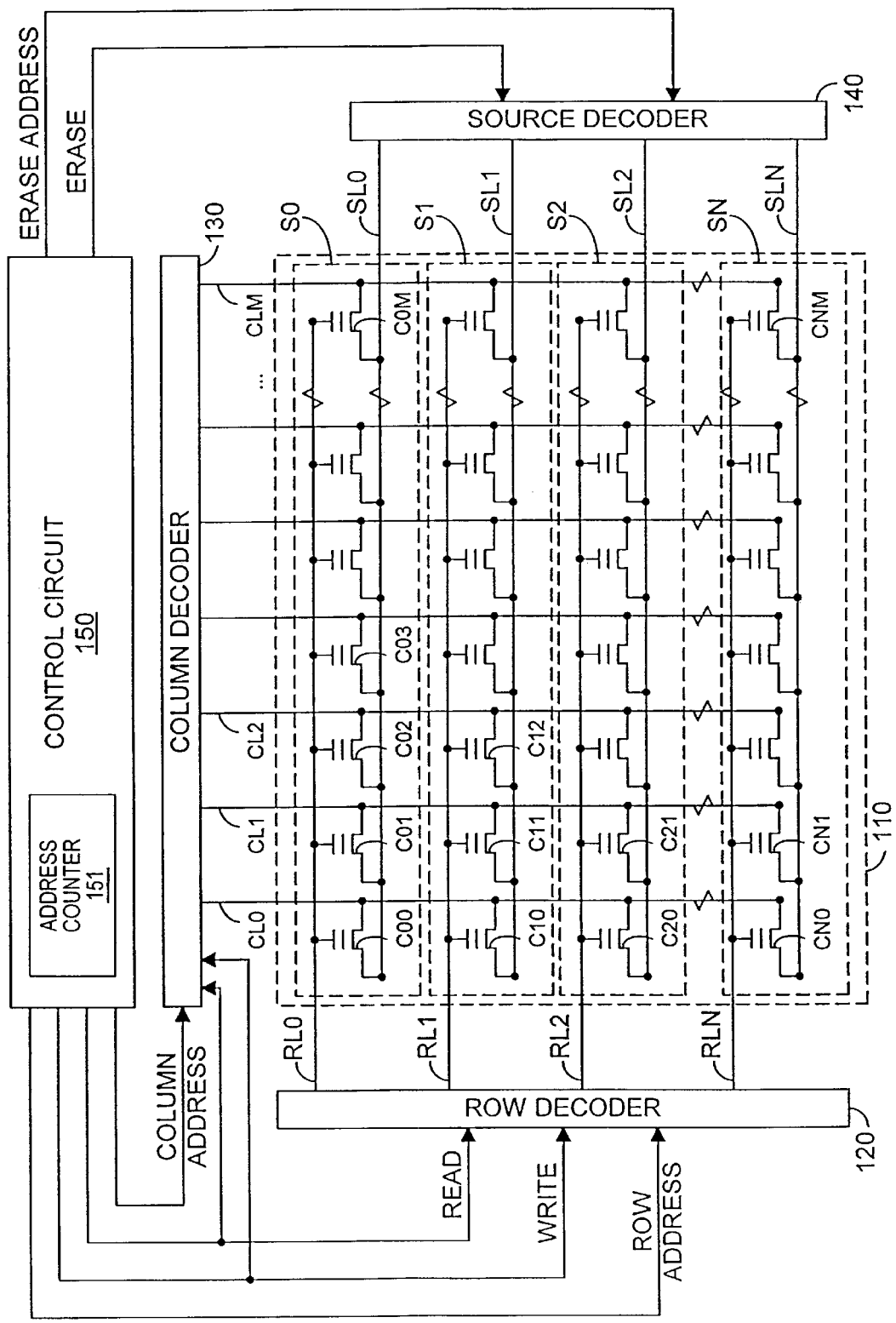
FIG. 1 shows a Flash memory which in accordance with an aspect of the invention can access memory cells in one sector of an array while erasing another sector of the memory array.

FIG. 1 shows a memory 100 in accordance with an embodiment of the invention. Memory 100 contains an array 110 of non-volatile memory cells C00 to CNM. In FIG. 1, each memory cell C00 to CNM is a floating gate transistor, but alternative memory cell architectures include memory cells containing split-gate transistors or a combination of memory transistors and select transistors. Array 110 has N+1 rows and M+1 columns. Each row of memory cells C00–C0M, C10–C1M, . . . CN0–CNM is associated with the one of row lines RL0 to RLN that couples to the control gates of the memory cells in the row. Each column of memory cells C00–CN0, C01–CN1, . . . C0M–CNM is associated with the one of column lines CL0 to CLM that couples to the drains of the memory cells in the column. Memory 100 is a flash memory such as a Flash EPROM or Flash EEPROM. Accordingly, memory array 110 is further organized into N+1 independently erasable sectors S0 to SN. Each sector S0 to SN contains a single row of memory cells and is associated with the one of source lines SL0 to SLN that is connected to the sources of memory cells in the row.

In array 110, each of the memory cells C00 to CNM comprises a floating gate transistor which has a threshold voltage corresponding to an erased state of the memory cell or a value stored in the memory cell. In an exemplary embodiment of the invention, memory 100 is an analog memory, and each memory cell C00 to CNM has a continuous range of possible threshold voltages that corresponds to a continuous range of stored analog values. Alternatively, memory 100 can be a digital (binary or multi-bit-per-cell) memory where the threshold voltage of the memory cell indicates one of a set of possible discrete digital values.

Connected to array 110 are a row decoder 120, a column decoder 130, and a source decoder 140. Row decoder 120 couples to row lines RL0 to RLN and biases row lines RL0 to RLN as required for read or write operations. In the exemplary embodiment, row decoder 120 includes a transistor tree and row line drivers. The transistor tree decodes a row address signal to identify a selected row line. The row line drivers control the voltages on the selected row line and on unselected row lines. Signals READ and WRITE respectively indicate read and write operations, and row decoder 120 selects a row line voltage according to whether the selected memory cell is being read or written. Column decoder 130 couples to column lines CL0 to CLM and applies bias voltages to column lines CL0 to CLM as required for a read or write operation. In the exemplary embodiment, column decoder 130 includes a transistor tree that decodes a column address signal to identify a selected column line, drivers that control the voltages on the selected column line, and a sense amplifier that column decoder 130 connects to the selected column line during a read. (Elements in row decoder 120 and column decoder 130 are not shown for simplicity.)

Figure 2:
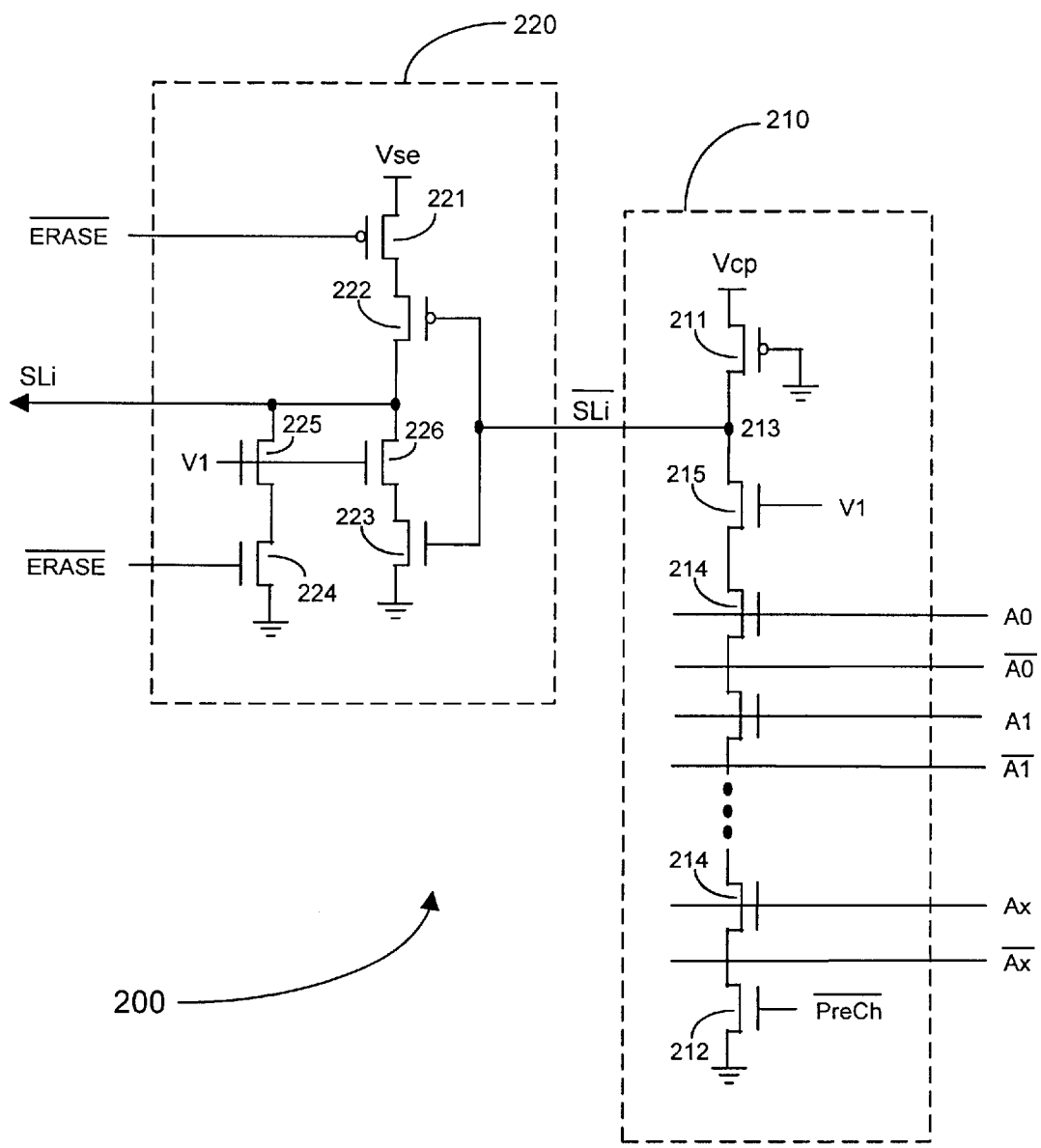
FIG. 2 shows a source-line decoder and driver for use in one embodiment of the Flash memory of FIG. 1.

Source decoder 140 couples to source lines SL0 to SLN. FIG. 2 shows one embodiment of a decoding circuit 200 that source decoder 140 uses to control voltages for memory cells on source-line SLi (i=0 to N) during an erase operation. Decoding circuit 200 includes a decoder tree 210 that decodes an erase address signal comprising signals A0 to Ax and $\overline{A0}$ to $\overline{Ax}$ for identifying a selected sector being erased. Decoding circuit 200 also includes a source-line driver 220 that applies an erase voltage to the selected source line. Source decoder 140 grounds all source lines except the selected source line and grounds the selected source line unless signal $\overline{ERASE}$ indicates the selected source line is currently being erased. For each row in array 110, source decoder 140 contains decoding circuits similar to circuit 200.

Decoder tree 210 generates a signal $\overline{SLi}$ which is the complement of signal SLi and indicates whether the ith row contains the selected memory cell. Before a write, a signal $\overline{PreCh}$ is asserted low which turns off n-channel transistor 212, and allows node 213 (select signal $\overline{SLi}$) to charge up to a voltage Vcp through grounded gate p-channel transistor 211. A charge pump or other high voltage source (not shown) supplies voltage Vcp which is greater than erase voltage Vse. Row address signals A0 to Ax and $\overline{A0}$ to $\overline{Ax}$ are applied to decoder tree 210 during precharge which charges a conducting string of transistors 214 connected to node 213. When signal $\overline{PreCh}$ goes high, transistor 212 is turned on. Signal $\overline{SLi}$ remains high unless transistors 214 all conduct which pulls signal $\overline{SLi}$ low. P-channel device 211 is designed such that its impedance (or on-resistance) is large relative to the effective combined impedance of the string of stacked n-channel devices in decoder tree 210. As a result, only a small amount of D.C. current will flow through the selected decoder tree. A unique combination of row address signals A0 to Ax and $\overline{A0}$ to $\overline{Ax}$ is connected to the gates of transistors 214 in each copy of decoding circuit 200 so that only one signal SL0 to SLN is asserted.

During an erase of the memory cells in the ith row of array 110, the row address identifies the ith row so that signals SLi and $\overline{SLi}$ are asserted high and low respectively. In source-line driver 220 signals $\overline{ERASE}$ and $\overline{SLi}$ are low during an erase of the ith row and turn on p-channel transistors 221 and 222 to connect source-line SLi to an erase voltage Vse (typically about 12V). For unselected rows, signal $\overline{SLi}$ is high, and transistor 222 disconnects unselected source-lines from the erase voltage Vse and turns on n-channel transistor 223 which connects source lines to ground. Alternatively, the unselected source-lines can be left floating or biased to a pre-determined voltage. When nor performing an erase operation, signal $\overline{ERASE}$ is high, which turns on n-channel transistor 224 in each source-line driver 220 to ground the source-lines. A voltage V1 (approximately 6 to 7 volts) is applied to the gates of n-channel transistors 225 and 226 of source-line driver 220 to reduce substrate current during high voltage switching. Other source decoders are also suitable for this invention, such as described in commonly-owned U.S. patent application Ser. No. 08/781,741, now U.S. Pat. No. 5,923,585, entitled "Source Biasing Using Row-Based Sectors", filed Jan. 10, 1997, which is hereby incorporated by reference in its entirety. In Ser. No. 08/781, 741, the source decoder biases unselected source-lines to a predetermined voltage and biases the selected source-lines to an erase voltage (e.g., 12 volts) for erase operations. Such a source decoder reduces program-disturb and over-erase effects. For a Flash memory, column decoder 130 is disabled during the erase operation so that all of the bit-lines of array 110 are floating.

In accordance with an aspect of the invention, memory 100 can perform one or more write operations while erasing a sector. To initiate an erase operation, a control circuit 150 generates an erase address signal identifying a selected erase sector to be erased and asserts signal ERASE to commence the erase operation. In response, source decoder 140 applies an erase voltage Vse (typically about 12 volts) to the source line associated with the selected erase sector and grounds all other source lines, as described above. If no read or write operations are currently being conducted, row decoder 120 grounds all of the word lines RL0 to RLN, and column decoder 130 allows all of the column lines CL0 to CLM to float. During an erase operation, control circuit 150 can commence a write or read operation to any memory cell except the memory cells in the selected erase sector. An erase operation is complete after a predetermined time believed to be sufficient to lower the threshold voltages of the memory cells in the selected sector to the erased state. Alternatively, different erase algorithms can also be embedded on the chip, such as to provide threshold voltage (Vt) monitoring of the memory cells and automatically stopping the erase operation when the threshold voltages reach a predetermined value.

To commence the write operation, control circuit 150 asserts signal WRITE and generates a row address and a column address. The row and column addresses identify a selected row line and a selected column line (or lines) which are coupled to the memory cell (or cells) selected for programming. (Multiple cells and associated column lines are selected for digital write processes that simultaneously write bits of a binary value to multiple memory cells.) In response to signal WRITE, row decoder 120 applies programming voltage Vrp (typically 8 to 12 volts) to the selected row line, but leaves the unselected row lines grounded. Column decoder 130 applies a programming voltage Vw (typically 5 to 6 volts) to the selected column line (or lines) and allows the unselected column lines to float. Table 2A below indicates the voltage applied to memory cells in different portions of array 110 for a combined write and erase operation, using a grounded-gate erase scheme.

TABLE 2A

| Location | Vgate | Vsource | Vdrain |
|---|---|---|---|
| Unselected Row Unselected Column (Not in the Selected Sector for Erase) | 0 V | 0 V | Floats |
| Unselected Row Unselected Column (In the Selected Sector for Erase) | 0 V | Vse (12 V) | Floats |
| Unselected Row Selected Column (Not in the Selected Sector for Erase) | 0 V | 0 V | Vw (5–6 V) |
| Unselected Row Selected Column (In the Selected Sector for Erase) | 0 V | Vse (12 V) | Vw (5–6 V) |
| Selected Row Unselected Column (In the Selected Sector for Write) | Vrp (8–12 V) | 0 V | Floats |
| Selected Row Selected Column (In the Selected Sector for Write) | Vrp (8–12 V) | 0 V | Vw (5–6 V) |

Note that for erasing using the negative-gate erase scheme, as shown in Table 2B below, the voltage applied to the gates of memory cells in the selected sector for erase is approximately −10 volts instead of 0 volts, and the voltage Vse applied to the sources of memory cells in the selected sector for erase is approximately 5 volts instead of approximately 12 volts.

TABLE 2B

| Location | Vgate | Vsource | Vdrain |
|---|---|---|---|
| Unselected Row Unselected Column (Not in the Selected Sector for Erase) | 0 V | 0 V | Floats |
| Unselected Row Unselected Column (In the Selected Sector for Erase) | ~−10 V | Vse (5 V) | Floats |
| Unselected Row Selected Column (Not in the Selected Sector for Erase) | 0 V | 0 V | Vw (5–6 V) |
| Unselected Row Selected Column (In the Selected Sector for Erase) | ~−10 V | Vse (5 V) | Vw (5–6 V) |
| Selected Row Unselected Column (In the Selected Sector for Write) | Vrp (8–12 V) | 0 V | Floats |
| Selected Row Selected Column (In the Selected Sector for Write) | Vrp (8–12 V) | 0 V | Vw (5–6 V) |

Erase voltage Vse does not disturb the write process because memory array 110 has row based sectors, and erase voltage Vse is not applied to the source line coupled to the selected memory cell (or cells). Similarly, programming voltage Vrp does not disturb erasing of the selected sector because row decoder 120 does not apply programming voltage Vrp to a row line in the selected sector for erase.

Thus, none of the memory cells in array 110 are simultaneously subjected to programming voltage Vrp and erase voltage Vse.

Programming voltage Vw on the selected column line can potentially affect the erase operation since the selected column line for the write operation crosses the selected sector for the erase operation and changes the drain voltage for some of the memory cells in the selected sector. However, since the row lines in the selected sector are grounded (for a grounded-gate erase scheme) or at approximately −10 volts (for a negative-gate erase scheme), none of the memory cells turn on or conduct significant current either with programming voltage Vw applied or during the time the cells are being erased. In fact, the positive biasing voltages at the source (due to Vse) and at the drain (due to Vw) increase the effective threshold voltage Vt of the memory cell because of the body effects, for example. The impact due to differences in drain voltage is insignificant for several reasons. In particular, the difference in floating gate voltage between a memory cell in the selected sector for erase but not in the selected column for write and a memory cell in the selected sector for erase and selected column for write depends on the capacitive components of the memory cells (particularly the capacitance between the floating gate and drain) and is relatively small. Further, the write operation induces channel hot electron injection to change the threshold voltage of the selected memory cell, but the erase operation depends on Fowler-Nordheim tunneling. Accordingly, the write operation is faster than the erase operation and does not affect any particular memory cell for a significant portion of the erase time. Finally, a set of write operations to a whole selected row distributed evenly to all of the columns of array 110 during an erase has little or no detrimental effect on the memory cells being erased. For example, if the typical erase time of a sector is 10 ms and write time of a memory cell is 10 $\mu$s, then each row can be optimized with 1,000 cells or 1,000 columns.

In the exemplary embodiment of the invention where memory 100 is an analog/multi-level or multi-bit-per-cell memory, the write operation raises the threshold voltage of a single selected memory cell to a level indicating an analog value being written. An exemplary write process applies programming voltages in a series of programming cycles that are interwoven with a series of verify cycles. During each programming cycle, programming voltages Vrp and Vw are applied to the selected row and column lines as described above and increase the threshold voltage of the select memory cell. The levels of one or both of programming voltage Vrp and Vw can be selected according to the analog/multi-level value being written. For example, for an analog/multi-level value corresponding to a relatively high threshold voltage, programming voltages Vrp and Vw can be near the upper limits of respective ranges to cause faster changes in the threshold voltage. For an analog/multi-level value corresponding to a relatively low threshold voltage, programming voltages Vrp and Vw can be near the lower limits of respective ranges to provide greater control of changes in the threshold voltage. Programming voltages Vrp and Vw can also change during the programming process, for example, decreasing as the threshold voltage of the memory cell nears a target level.

The verify cycles determine whether the threshold voltage of the selected memory cell has reached the target level. For one exemplary verify cycle, row decoder 120 applies to the selected row line a target voltage equal to or has a one-to-one correspondence with the desired threshold voltage of the selected cell, and column decoder 130 applies a low voltage (typically 1 to 2 volts) to the selected column line and connects a sense amplifier (not shown) to the selected column line. The sense amplifier senses current on the selected column line. If the selected memory cell on the selected column line still conducts, one or more further programming cycles are required. If the selected memory cell does not conduct, the sense amplifier sense current indicates that the threshold voltage of the selected memory cell has reached the target voltage and the write operation is complete. A simultaneous erase operation does not affect such verify cycles since none of the memory cells in the selected sector conduct during the erase operation, assuming the memory cells do not over-erase to depletion, i.e., turning on the transistor with the gate grounded.

Read processes can similarly be performed simultaneously with an erase operation provided that none of the memory cells in the sector selected for an erase are read. The erase operation is the same as the erase operation described above with respect to the simultaneous write and erase. To commence a read operation, control circuit 150 asserts signal READ and generates a row address and a column address. The row and column addresses identify a selected row line and a selected column line (or lines) which are coupled to the memory cell (or cells) selected for reading. In response to signal READ, row decoder 120 applies read voltage Vrr (typically ~3 to 7 volts) to the selected row line, but leaves the unselected row lines grounded. Column decoder 130 applies a read voltage Vr (e.g., ~1.5 volts) to the selected column line (or lines) and allows the unselected column lines to float. Table 3A below indicates the voltage applied to memory cells in different portions of array 110 for a combined read and erase operation.

TABLE 3A

| Location | Vgate | Vsource | Vdrain |
|---|---|---|---|
| Unselected Row Unselected Column (Not in the Selected Sector for Erase) | 0 V | 0 V | Floats |
| Unselected Row Unselected Column (In the Selected Sector for Erase) | 0 V | Vse (12 V) | Floats |
| Unselected Row Selected Column (Not in the Selected Sector for Erase) | 0 V | 0 V | Vr (~1.5 V) |
| Unselected Row Selected Column (In the Selected Sector for Erase) | 0 V | Vse (12 V) | Vr (~1.5 V) |
| Selected Row Unselected Column (In the Selected Sector for Read) | Vrr (~3 to 7 V) | 0 V | Floats |
| Selected Row Selected Column (In the Selected Sector for Read) | Vrr (~3 to 7 V) | 0 V | Vr (~1.5 V) |

Note that for erasing using the negative-gate erase scheme, as shown in Table 3B below, the voltage applied to the gates of memory cells in the selected sector for erase is approximately −10 volts instead of 0 volts, and the voltage Vse applied to the sources of memory cells in the selected sector for erase is approximately 5 volts instead of approximately 12 volts.

TABLE 3B

| Location | Vgate | Vsource | Vdrain |
|---|---|---|---|
| Unselected Row Unselected Column (Not in the Selected Sector for Erase) | 0 V | 0 V | Floats |
| Unselected Row Unselected Column (In the Selected Sector for Erase) | ~–10 V | Vse (5 V) | Floats |
| Unselected Row Selected Column (Not in the Selected Sector for Erase) | 0 V | 0 V | Vr (~1.5 V) |
| Unselected Row Selected Column (In the Selected Sector for Erase) | ~–10 V | Vse (5 V) | Vr (~1.5 V) |
| Selected Row Unselected Column (In the Selected Sector for Read) | Vrr (~3 to 7 V) | 0 V | Floats |
| Selected Row Selected Column (In the Selected Sector for Read) | Vrr (~3 to 7 V) | 0 V | Vr (~1.5 V) |

A variety of read operations are known which rely on sensing the current or voltage on selected column lines. These read operations are unaffected by the simultaneous erase operation since none of the memory cells in the selected sector for erase conduct or change the voltage on the column lines. Similarly, a small bias voltage Vr (~1.5 V) applied to the drain of the selected memory cell for read should not affect the erase operation in the selected sector for erase.

In the exemplary embodiment, control circuit 150 can perform a write or programming operation with look-ahead erase. In particular, control circuit 150 includes an address counter 151 indicating a row address and column address for a memory cell to be accessed. When beginning a write operation, the address counter 151 is initialized to the address of the first memory cell in a sector where data is to be written. Control circuit 150 then simultaneously generates a row address signal, a column address signal, and an erase address signal. The erase address signal is restricted to indicating a different sector from the sector identified by the row address signal and may be equal to one more or one less than the row address. The erase address can also be unrelated to the row address. Control circuit 150 also asserts signals ERASE and WRITE to begin simultaneous erase and write operations. During the erase operation, control circuit 150 sequentially increments (or decrements) the column address as data values are written. The erase operation should be complete upon writing to the last memory cell in the row. At this point, control circuit 150 increments (or decrements) the row address to a value corresponding to the sector just erased and increments (or decrements) the source decoder address to select the next sector to be erased. By repeating the above steps, a continuous write or programming process can be maintained without delays due to the erase operation, thereby essentially "hiding" the erase time.

Figure 3:
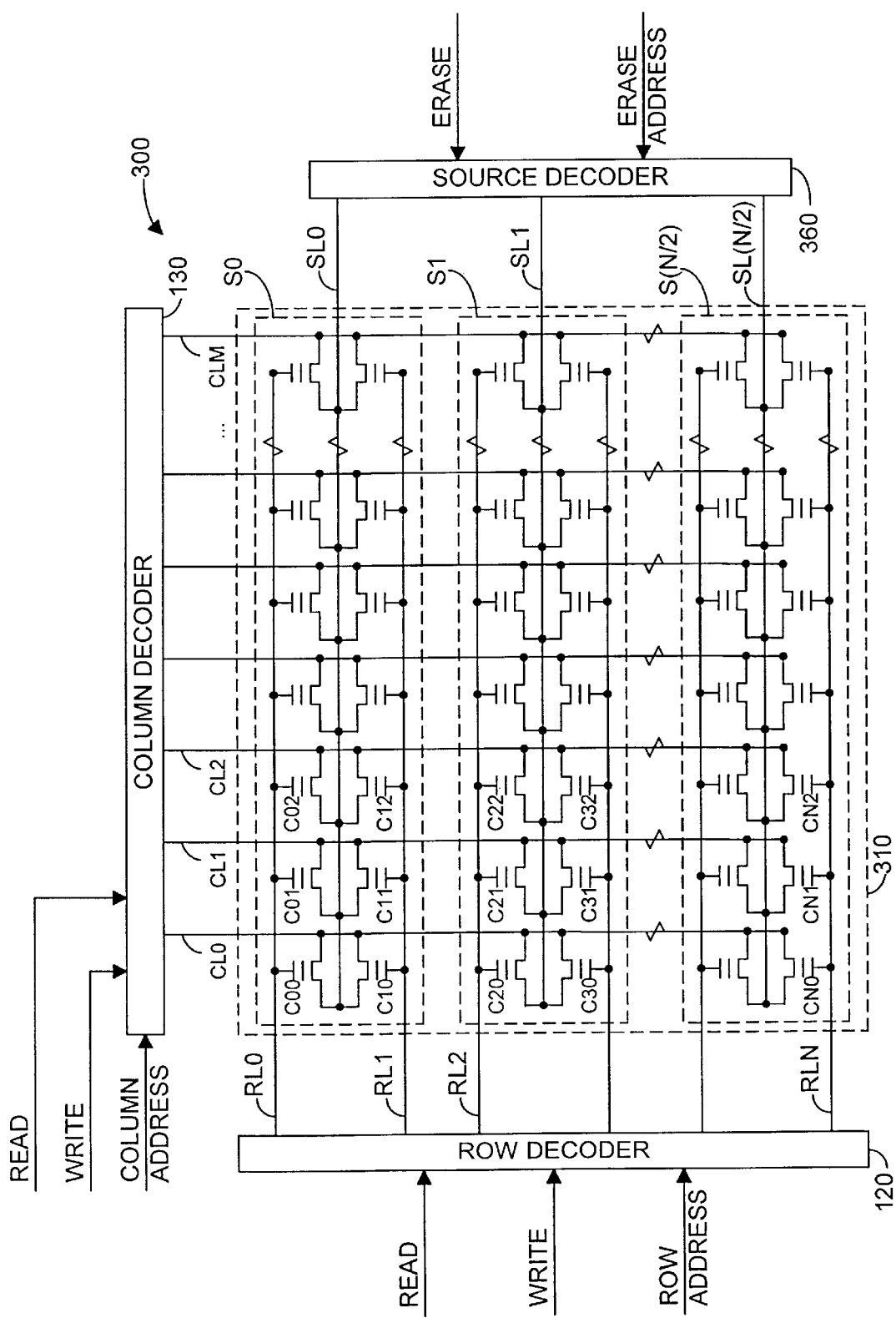
FIG. 3 shows another Flash memory which in accordance with an aspect of the invention can access memory cells in one sector of an array while erasing another sector of the memory array.

FIG. 3 illustrates a memory 300 also permitting simultaneous erase and read or write operations. Memory 300 differs from memory 100 in that the architecture of a memory array 310 in memory 300 includes multiple (specifically two) rows of memory cells per independently erasable sector, i.e., two rows of memory cells share the same source line. Accordingly, a source decoder 360 for memory 300 couples to fewer source lines SL0 to SL(N/2) and decodes an erase address having fewer significant bits than does the row address. Memory 300 otherwise operates in the same fashion as described above for memory 100 of FIG. 1. In particular, memory 300 can simultaneously erase a sector and access a memory cell provided that the memory cell being accessed is not in the sector being erased. In this case, the maximum erase time is equal to or less than the time required to write to or read from two rows of memory cells.

Although the invention has been described with reference to particular embodiments, the description is only an example of the invention's application and should not be taken as a limitation. In particular, even though much of preceding discussion was aimed at memory that lower threshold voltages to erase memory cells and raise threshold voltages to write memory cells, alternative embodiments of this invention include memories where the erased state of a memory cell has a relatively high threshold voltage. Further, embodiments of the invention are not limited to the specific memory cell architecture are described. Various other adaptations and combinations of features of the embodiments disclosed are within the scope of the invention as defined by the following claims.

We claim:

1. A method for operating a memory, comprising simultaneously:
   erasing memory cells in a first row of a memory array, wherein erasing comprises:
   applying a first voltage to a first row line that is coupled to control gates of the memory cells in the first row; and
   applying a second voltage to a first source line that is coupled to sources of the memory cells in the first row; and
   accessing a selected memory cell in a second row of the memory array, wherein accessing the selected memory cell comprises:
   applying a third voltage to a second row line that is coupled to control gates of memory cells in the second row;
   applying a fourth voltage to a second source line that is coupled to sources of the memory cells in the second row; and
   applying a fifth voltage to a column line that is connected to a drain of the selected memory cell and to a drain of one of the memory cells in the first row.

2. The method of claim 1, wherein accessing the selected memory cell comprises writing to the selected memory cell.

3. The method of claim 2, wherein the third, fourth, and fifth voltages combined are sufficient to induce channel hot electron injection that changes a threshold voltage of the selected memory cell.

4. The method of claim 3, wherein:
   the first voltage is ground potential; and
   the second voltage is a voltage sufficient to induce electron tunneling that erases memory cells in the first row.

5. The method of claim 3, wherein:
   the first voltage is approximately –10 volts; and
   the second voltage is a voltage sufficient to induce electron tunneling that erases memory cells in the first row.

6. The method of claim 1, wherein accessing the selected memory cell comprises reading the selected memory cell.

7. The method of claim 1, further comprising applying the first voltage to all row lines in the memory array except the second row line.

8. The method of claim 1, further comprising allowing all column lines in the memory array to float except the column line that is connected to the drain of the selected memory cell.

9. The method of claim 1, further comprising applying the second voltage to all source lines containing memory cells to be erased.

10. The method of claim 1, wherein the first and fourth voltages are the same.

11. The method of claim 1, wherein:
the first voltage is ground potential; and
the second voltage is a voltage sufficient to induce electron tunneling that erases memory cells in the first row.

12. The method of claim 1, wherein:
the first voltage is approximately −10 volts; and
the second voltage is a voltage sufficient to induce electron tunneling that erases memory cells in the first row.

13. The method of claim 12, wherein the second voltage is approximately 5 volts.

14. The method of claim 1, further comprising accessing a selected memory cell in the first row of the memory array after erasing the memory cells in the first row.

15. The method of claim 14, further comprising simultaneous with accessing the selected memory cell in the first row, erasing memory cells in a third row of the memory array.

16. The method of claim 1, wherein the sources of memory cells in the first row are coupled to sources of memory cells in a third row of the memory array.

17. A method of operating a memory, comprising:
applying a first voltage to source lines coupled to sources of memory cells to be erased; and
applying a second voltage to row lines coupled to control gates of memory cells to be accessed, wherein the memory cells to be erased and the memory cells to be accessed are in different rows.

18. The method of claim 17, further comprising:
applying a third voltage to column lines coupled to drains of the memory cells to be accessed, wherein the third voltage is a positive voltage; and
floating column lines coupled to drains of the memory cells to be erased.

19. The method of claim 18, further comprising:
applying a fourth voltage to source lines coupled to sources of the memory cells to be accessed; and
applying a fifth voltage to row lines coupled to control gates of the memory cells to be erased.

20. The method of claim 17, wherein the first voltage is approximately 12 volts, and the second voltage is approximately 8 to 12 volts when the accessing is a write operation and is approximately 3 to 7 volts when the accessing is a read operation.

21. The method of claim 18, wherein the accessing is a write operation, and the third voltage is approximately 5 to 6 volts.

22. The method of claim 18, wherein the accessing is a read operation, and the third voltage is approximately 1.5 volts.

23. The method of claim 19, wherein the fourth and fifth voltages are approximately 0 volts.

24. The method of claim 19, wherein the first voltage is a voltage sufficient to induce electron tunneling for erasing memory cells, and wherein the fifth voltage is approximately −10 volts.

25. A memory comprising:
a memory array comprising:
a plurality of memory cells arranged in rows and columns;
a plurality of row lines, each row line being coupled to control gates of the memory cells that are in a row associated with the row line;
a plurality of column lines, each column line being coupled to drains of the memory cells that are in a column associated with the column line; and
a plurality of source lines, each source line being coupled to sources of the memory cells that are in a row associated with the source line;
a row decoder coupled to the plurality of row lines;
a source decoder coupled to the plurality of source lines;
a column decoder coupled to the plurality of column lines; and
a control circuit capable of simultaneously asserting a first address signal to the source decoder, a second address signal to the row decoder, and a third address signal to the column decoder, the first address signal identifying which of the source lines is coupled to memory cells being erased, the second address signal identifying which of the row lines is coupled to a selected cell being accessed, the third address signal identifying which of the column lines is coupled to a selected cell being accessed.

26. The memory of claim 25, wherein the first address signal is different than the second address signal.

27. The memory of claim 25, wherein the memory is a Flash memory.

28. The memory of claim 25, wherein the source decoder, based on the first address signal, applies a positive erase voltage to source lines coupled to memory cells being erased and applies approximately 0 volts to source lines coupled to memory cells being accessed.

29. The memory of claim 25, wherein the row decoder, based on the second address signal, applies a first access voltage to row lines coupled to memory cells being accessed and applies approximately 0 volts to row lines coupled to memory cells being erased.

30. The memory of claim 25, wherein the row decoder, based on the second address signal, applies a first access voltage to row lines coupled to memory cells being accessed and applies approximately −10 volts to row lines coupled to memory cells being erased.

31. The memory of claim 25, wherein the column decoder, based on the third address signal, applies a positive second access voltage to column lines coupled to memory cells being accessed and floats column lines coupled to memory cells being erased.

32. The memory of claim 29, wherein the first access voltage is approximately 8 to 12 volts for a write operation and approximately 3 to 7 volts for a read operation.

33. The memory of claim 30, wherein the first access voltage is approximately 8 to 12 volts for a write operation and approximately 3 to 7 volts for a read operation.

34. The memory of claim 31, wherein the second access voltage is approximately 5 to 6 volts for a write operation and approximately 1.5 volts for a read operation.

35. The memory of claim 25, wherein each source line also being coupled to sources of the memory cells that are in N additional rows associated with the source line such that the number of source lines is equal to the fraction $1/(N+1)$ of the number of row lines in the memory array.

36. The memory of claim 35, wherein N=1.

37. The memory of claim 25, wherein the control circuit comprises an address counter for sequentially changing the third address signal after each memory cell is accessed.

38. The memory of claim 37, wherein the address counter, after the last of the memory cells in the row being erased has been erased, changing the first address signal to a signal identifying which of the source lines is coupled to memory cells to be erased next and changing the second address signal to a signal identifying which of the row lines is coupled to a selected cell being accessed next.

39. The memory of claim 25, wherein cells in a first row are erased at the same time cells in a second row are sequentially accessed.

40. The memory of claim 39, wherein cells in the first row are sequentially accessed after cells in the first row are erased and at the same time cells in a third row are erased.

41. A method of operating an array of memory cells, comprising:
   selecting a first set of memory cells to erased;
   selecting a second set of memory cells to be accessed for a non-erasing operation, wherein the memory cells to be erased and the memory cells to be accessed are in different rows of said array; and
   applying set of voltages simultaneously, said set of voltages comprising:
      a first voltage to the source lines coupled to sources of the first set of memory cells; and
      a second voltage to row lines coupled to control gates of the second set of memory cells.

42. The method of claim 41, wherein said second set of memory cells are accessed for a write operation, the first voltage is approximately 12 volts and the second voltage is approximately 8 to 12 volts.

43. The method of claim 41, wherein said second set of memory cells are accessed for a read operation, the first voltage is approximately 12 volts and the second voltage is approximately 3 to 7 volts.

44. The method of claim 41, said set of voltages further comprising:
   a third voltage to column lines coupled to drains of the second set of memory cells, wherein the third voltage is a positive voltage; and
   floating column lines coupled to drains of the first set of memory cells.

45. The method of claim 44, wherein said second set of memory cells are accessed for a write operation, and the third voltage is approximately 5 to 6 volts.

46. The method of claim 44, wherein said second set of memory cells are accessed for a read operation, and the third voltage is approximately 1.5 volts.

47. The method of claim 44, said set of voltages further comprising:
   a fourth voltage to source lines coupled to sources of the second set of memory cells; and
   a fifth voltage to row lines coupled to the first set of memory cells.

48. The method of claim 47, wherein the fourth and fifth voltages are approximately 0 volts.

49. The method of claim 47, wherein the first voltage is a voltage sufficient to induce electron tunneling for erasing memory cells, and wherein the fifth voltage is approximately 0 volts.

* * * * *